United States Patent
Tanabe et al.

(10) Patent No.: US 8,039,178 B2
(45) Date of Patent: *Oct. 18, 2011

(54) MANUFACTURING METHOD OF TRANSPARENT SUBSTRATE FOR MASK BLANKS, MANUFACTURING METHOD OF MASK BLANKS, MANUFACTURING METHOD OF EXPOSURE MASKS, MANUFACTURING METHOD OF SEMICONDUCTOR DEVICES, MANUFACTURING METHOD OF LIQUID CRYSTAL DISPLAY DEVICES, AND DEFECT CORRECTION METHOD OF EXPOSURE MASKS

(75) Inventors: Masaru Tanabe, Kitakoma-gun (JP); Masaru Mitsui, Hokuto (JP)

(73) Assignee: Hoya Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/952,360

(22) Filed: Nov. 23, 2010

(65) Prior Publication Data

US 2011/0123912 A1 May 26, 2011

Related U.S. Application Data

(62) Division of application No. 11/630,131, filed as application No. PCT/JP2005/011434 on Jun. 22, 2005, now Pat. No. 7,862,960.

(30) Foreign Application Priority Data

Jun. 22, 2004 (JP) .................................. 2004-183287

(51) Int. Cl.
G03F 1/00 (2006.01)

(52) U.S. Cl. ...................................... 430/5; 204/192.12

(58) Field of Classification Search . 430/5; 204/192.12; 250/492.2; 427/595; 438/158
See application file for complete search history.

(56) References Cited

U.S. PATENT DOCUMENTS 5,358,806 A 10/1994 Haraichi et al.
(Continued)

FOREIGN PATENT DOCUMENTS

JP 53-6026 1/1978
(Continued)

OTHER PUBLICATIONS

Japanese Office Action corresponding to Japanese Patent Application No. 2005-181456, dated Jun. 8, 2010.
(Continued)

*Primary Examiner* — Mark F Huff
*Assistant Examiner* — Stewart Fraser
(74) *Attorney, Agent, or Firm* — Sughrue Mion, PLLC

(57) ABSTRACT

There are provided a manufacturing method of a transparent substrate for a mask blank, a mask blank, or an exposure mask adapted to prevent occurrence of a transfer pattern defect or a mask pattern defect, by correcting a recessed defect existing on the surface of the transparent substrate, and a defect correction method of an exposure mask.
With respect to an exposure mask having a transparent substrate 1 formed thereon with a mask pattern 2 which becomes a transfer pattern, correction is performed by removing, by the use of a needle-shaped member 4, a peripheral portion of a recessed defect 3 formed on a surface 1a of the substrate, where the mask pattern 2 is not formed, so as to induce a reduction in transmission light quantity which causes a transfer pattern defect, thereby reducing a level difference between the surface of the substrate and the depth of the recessed defect. This correction of the recessed defect is carried out at the stage before forming a mask pattern forming thin film on the transparent substrate. A mask blank and an exposure mask are manufactured by the use of the transparent substrate applied with the correction of the recessed defect.

26 Claims, 3 Drawing Sheets

U.S. PATENT DOCUMENTS

| | | | |
|---|---|---|---|
| 6,037,083 A | 3/2000 | Mitsui | |
| 6,294,295 B1 | 9/2001 | Lin et al. | |
| 6,346,352 B1 | 2/2002 | Hayden et al. | |
| 6,841,315 B2 * | 1/2005 | Imura | 430/5 |
| 2001/0006754 A1 | 7/2001 | Okazaki et al. | |
| 2001/0028982 A1 | 10/2001 | Okazaki et al. | |
| 2004/0131953 A1 | 7/2004 | Sugiyama et al. | |
| 2004/0161674 A1 | 8/2004 | Nozute | |
| 2005/0244722 A1 | 11/2005 | Okada et al. | |

FOREIGN PATENT DOCUMENTS

| | | |
|---|---|---|
| JP | 55-154733 A | 12/1980 |
| JP | 56-35423 A | 4/1981 |
| JP | 62-257167 A | 11/1987 |
| JP | 4307545 A | 10/1992 |
| JP | 2001235849 A | 8/2001 |
| JP | 3251665 B2 | 11/2001 |
| JP | 2001337438 A | 12/2001 |
| JP | 2002189280 A | 7/2002 |
| JP | 2002189281 A | 7/2002 |
| JP | 2003-43669 A | 2/2003 |
| JP | 3422935 B2 | 4/2003 |
| JP | 2003195483 A | 7/2003 |
| JP | 2003241363 A | 8/2003 |
| JP | 2005037933 A | 2/2005 |
| JP | 2006-58777 A | 3/2006 |
| KR | 20000047011 A | 7/2000 |
| KR | 20020050168 A | 6/2002 |
| WO | 98/47172 A1 | 10/1998 |

OTHER PUBLICATIONS

Korean Office Action, mailed Jul. 4, 2009.

* cited by examiner

[Fig. 1]
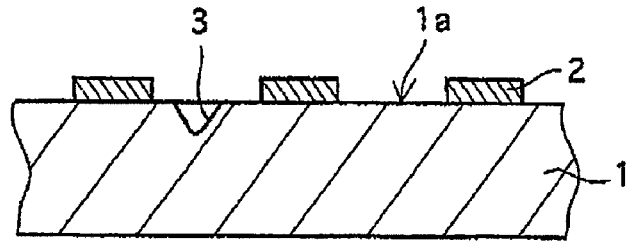
[Fig. 2]
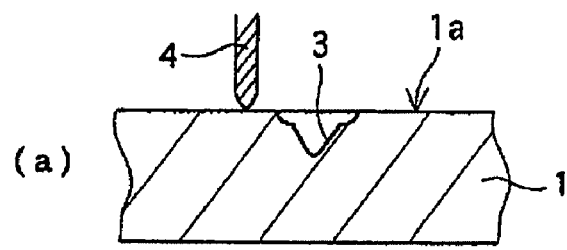
(a)
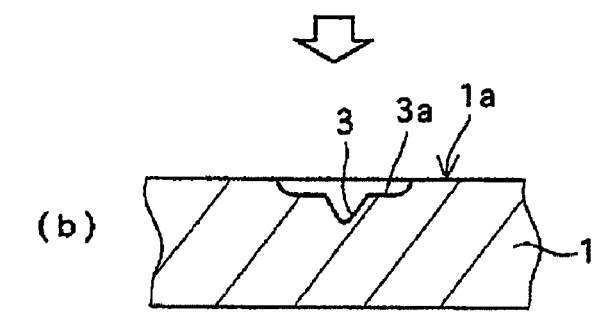
(b)
[Fig. 3]
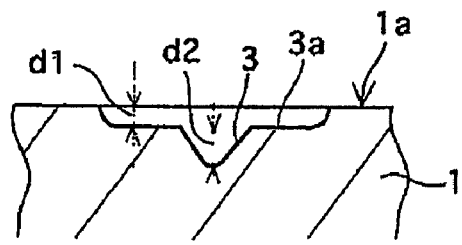
[Fig. 4]
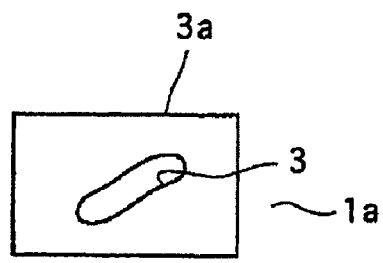

[Fig. 5]
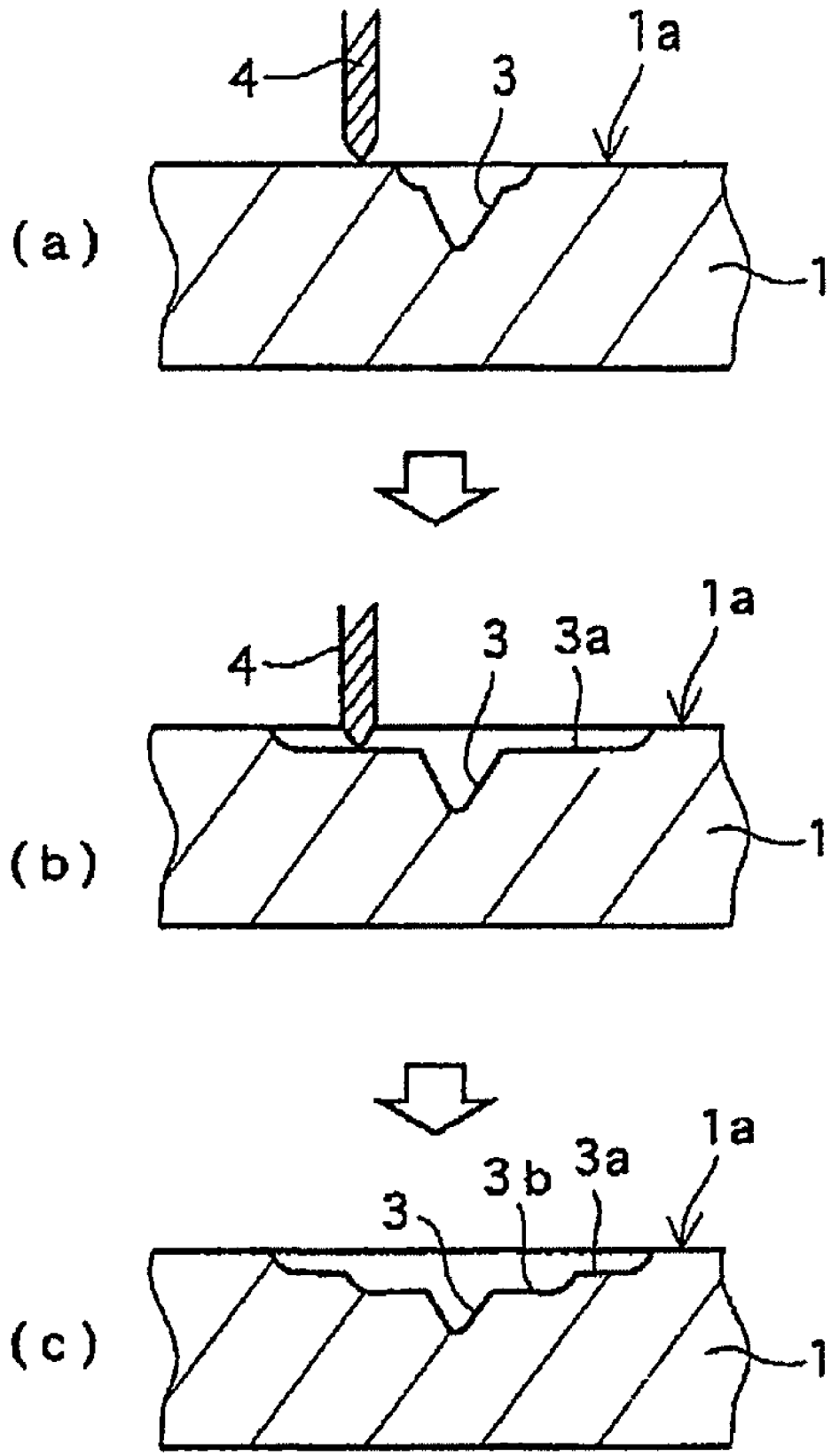

MANUFACTURING METHOD OF TRANSPARENT SUBSTRATE FOR MASK BLANKS, MANUFACTURING METHOD OF MASK BLANKS, MANUFACTURING METHOD OF EXPOSURE MASKS, MANUFACTURING METHOD OF SEMICONDUCTOR DEVICES, MANUFACTURING METHOD OF LIQUID CRYSTAL DISPLAY DEVICES, AND DEFECT CORRECTION METHOD OF EXPOSURE MASKS

This is a Divisional of application Ser. No. 11/630,131 filed Jun. 15, 2007, claiming priority based on Japan Patent Application No. 2004-183287 filed Jun. 22, 2004, the contents of all of which are incorporated herein by reference in their entirety.

TECHNICAL FIELD

This invention relates to an exposure mask defect correction method for correcting a defect formed on an exposure mask for use in the semiconductor device manufacture or the like, an exposure mask manufacturing method having a defect correction process according to such a defect correction method, a transparent substrate manufacturing method for correcting a defect formed on a transparent substrate for a mask blank being a base of an exposure mask, a mask blank manufacturing method and an exposure mask manufacturing method using such a transparent substrate, and a semiconductor device or liquid crystal display device manufacturing method for manufacturing a semiconductor device or a liquid crystal display device by the use of such an exposure mask.

BACKGROUND ART

In the exposure mask manufacture, an inspection is made to determine whether a mask pattern is formed on a transparent substrate according to a design. In this way, detection is made of, for example, a pinhole defect (white defect, clear defect) caused by removal of a film serving as a mask pattern which should not be removed and an etching-insufficient defect (black defect, dark defect) where part of a film is not removed and thus remains due to insufficient etching. When such a pinhole defect or etching-insufficient defect is detected, correction is made for it.

For correcting the foregoing white defect, there is, for example, a method of depositing a carbon film or the like in the pinhole according to an FIB (Focused Ion Beam) assist deposition method or a laser CVD method. For correcting the foregoing black defect, there is, for example, a method of removing the unwanted portion by irradiation of FIB or laser light.

Recently, a photomask defect correction method has been proposed which physically removes a projection-like defect formed on a glass substrate by the use of a fine probe having a pointed tip of a stylus profilometer or a scanning probe microscope (see Patent Document 1 and Patent Document 2).
Patent Document 1: Japanese Patent (JP-B) No. 3251665
Patent Document 2: Japanese Unexamined Patent Application Publication (JP-A) No. 2003-43669

DISCLOSURE OF THE INVENTION

Problem to be Solved by the Invention

As described above, according to the conventional exposure mask defect correction method, it is possible to perform the defect correction with respect to the black defect or white defect of the film or the projection-like defect formed on the transparent substrate such as the glass substrate or the like. However, with respect to a recess-shaped defect (hereinafter referred to as a recessed defect) such as a crack formed on the surface of a transparent substrate, there is no supplementary material having optically, chemically, and physically appropriate properties and it is thus impossible to correct the recessed defect by supplementation, and therefore, there has conventionally been no method for correcting the recessed defect.

A recessed defect such as a crack formed on the surface of a transparent substrate induces, simultaneously with a loss of the transmission light quantity due to scattering of exposure light, a reduction in transmission light quantity due to the interference effect of exposure light transmitted through the recessed defect and a peripheral portion of the recessed defect, thereby causing a transfer pattern defect on a transfer target. Therefore, conventionally, when the recessed defect is found on the surface of the transparent substrate in an exposure mask defect inspection, it is judged to be a defective product as an exposure mask because of correction thereof being impossible.

On the other hand, when a recessed defect such as a crack exists at the stage of a mask blank, i.e. on the mirror-polished surface of a transparent substrate, assuming that, at the time of forming a mask pattern by, for example, wet etching, the recessed defect is located at a boundary of the mask pattern (i.e. the recessed defect exists spanning from a region where the mask pattern is formed to a region where the mask pattern is not formed), there arises a problem that an etchant entering the recessed defect further etches a thin film forming the mask pattern to degrade the pattern shape, thereby causing a mask pattern defect such as eating (the state where part of the mask pattern is lacked). For example, in the case of a large-size photomask for use in manufacturing a liquid crystal display device or the like, wet etching is mainly used as etching for forming a mask pattern and, therefore, it is an important task to prevent occurrence of the foregoing mask pattern defect.

It is therefore an object of this invention to, firstly, provide a transparent substrate manufacturing method for a mask blank capable of correcting a recessed defect existing on the surface of a transparent substrate to cause a reduction in transmission light quantity, thereby preventing occurrence of a transfer pattern defect, or capable of correcting a recessed defect that causes a mask pattern defect due to invasion of an etchant as described above, thereby preventing occurrence of the mask pattern defect, and a mask blank and exposure mask manufacturing method using such a transparent substrate, secondly, provide an exposure mask defect correction method capable of correcting a recessed defect formed on the surface of a transparent substrate so as to suppress a reduction in transmission light quantity, thereby preventing a transfer pattern defect, and an exposure mask manufacturing method having a defect correction process according to such a defect correction method, and thirdly, provide a semiconductor device manufacturing method capable of forming a fine pattern on a semiconductor substrate with no pattern defect according to a lithography technique using such an exposure mask or a liquid crystal display device manufacturing method capable of forming a fine pattern on a substrate for a liquid crystal display device with no pattern defect according to such a lithography technique.

Means for Solving the Problem

In order to solve the foregoing problems, this invention has the following structures.

(Structure 1) A manufacturing method of a transparent substrate for a mask blank being a base of an exposure mask is provided. The method is characterized by specifying a recessed defective portion existing on a surface of the transparent substrate in a mask pattern forming region where a mask pattern which becomes a transfer pattern is formed, the defective portion having a depth large enough to induce a reduction in transmission light quantity which causes a transfer pattern defect, and removing a peripheral portion of the specified defective portion to reduce a level difference between the surface of the substrate and the depth of the defective portion, thereby suppressing the reduction in transmission light quantity so as not to cause the transfer pattern defect.

According to Structure 1, by specifying the recessed defect existing on the surface of the transparent substrate and having the depth large enough to induce the reduction in transmission light quantity which causes the transfer pattern defect, and carving to remove the peripheral portion of the specified recessed defect so as to reduce the level difference between the surface of the substrate and the depth of the recessed defect, there is obtained the transparent substrate for the mask blank that can prevent occurrence of the transfer pattern defect by suppressing the reduction in transmission light quantity which is induced, for example, by the interference effect due to transmission of exposure light at the recessed defect and the peripheral portion of the recessed defect. Further, since, as described above, it is possible to remove the recessed defect, which causes the reduction in transmission light quantity, at the stage of fabricating the mask blank, specifically, at the stage before forming a thin film for a mask pattern on the mirror-polished transparent substrate, correction of the recessed defect is not required at the stage where the exposure mask is fabricated.

(Structure 2) A manufacturing method of a transparent substrate for a mask blank being a base of an exposure mask is provided. The method is characterized by specifying a recessed defective portion existing on a surface of the transparent substrate in a mask pattern forming region where a mask pattern which becomes a transfer pattern is formed, the defective portion having a depth large enough to cause a mask pattern defect due to invasion of an etchant when forming the mask pattern by wet etching, and removing a peripheral portion of the specified defective portion to reduce a level difference between the surface of the substrate and the depth of the defective portion, thereby preventing occurrence of the mask pattern defect.

According to Structure 2, by specifying the recessed defect existing on the surface of the transparent substrate and having the depth large enough to cause the mask pattern defect due to invasion of the etchant when forming the mask pattern by wet etching, and carving to remove the peripheral portion of the specified recessed defect so as to reduce the level difference between the surface of the substrate and the depth of the recessed defect, there is obtained the transparent substrate for the mask blank that can prevent occurrence of the mask pattern defect. Further, since, as described above, it is possible to remove the recessed defect, which causes the mask pattern defect, at the stage of fabricating the mask blank, specifically, at the stage before forming the thin film for the mask pattern on the mirror-polished transparent substrate, correction of the mask pattern defect is not required at the stage where the exposure mask is fabricated.

(Structure 3) A manufacturing method of the transparent substrate for the mask blank according to Structure 1 or 2 is provided. The method is characterized by contacting a needle-shaped member with the surface of the substrate at the peripheral portion of the defective portion and carving it, thereby removing the peripheral portion of the defective portion.

According to Structure 3, by using the needle-shaped member as means for reducing the level difference between the surface of the substrate and the depth of the recessed defect, a material of the substrate can be physically removed with high accuracy with respect to a carving region and depth.

(Structure 4) A manufacturing method of the transparent substrate for the mask blank according to Structure 1 or 2 is provided. The method is characterized by contacting a frozen member, obtained by freezing a polishing liquid containing abrasive, with the surface of the substrate at the peripheral portion of the defective portion and carving it, thereby removing the peripheral portion of the defective portion.

According to Structure 4, by using the frozen member, obtained by freezing the polishing liquid containing the abrasive, as means for reducing the level difference between the surface of the substrate and the depth of the recessed defect, it is easy to carve and physically remove a relatively wide region of a material of the substrate and, therefore, it is suitable for correction of the recessed defect of the transparent substrate, for example, for a large-size mask blank.

(Structure 5) A manufacturing method of the transparent substrate for the mask blank according to Structure 1, 3, or 4 is provided. The method is characterized in that each of level differences from the defective portion to the surface of the substrate after removing the surface of the substrate at the peripheral portion of the defective portion has a depth that causes a reduction in transmission light quantity induced by an interference effect due to transmission of exposure light to be 5% or less.

According to Structure 5, by setting each of level differences from the recessed defect to the surface of the substrate after removing the surface of the substrate at the peripheral portion of the recessed defect to have a depth that causes the reduction in transmission light quantity induced by the interference effect due to transmission of the exposure light to be 5% or less, a change in line width of the transfer pattern can be suppressed to 10% or less so that the transfer pattern defect can be prevented.

(Structure 6) A manufacturing method of a mask blank is characterized by forming a mask pattern forming thin film on the surface of the transparent substrate obtained by the manufacturing method of the transparent substrate for the mask blank according to any of Structures 1 to 5.

According to Structure 6, there is obtained the mask blank removed of the recessed defect on the surface of the substrate which causes the reduction in transmission light quantity inducing the transfer pattern defect or causes the mask pattern defect. Further, since, as described above, it is possible to remove the recessed defect at the stage of fabricating the mask blank, correction of the recessed defect is not required at the stage of the exposure mask.

(Structure 7) A manufacturing method of an exposure mask is characterized by patterning the mask pattern forming thin film of the mask blank obtained by the manufacturing method of the mask blank according to Structure 6, thereby forming the mask pattern, which becomes the transfer pattern, on the transparent substrate.

According to Structure 7, by manufacturing the exposure mask by the use of the mask blank removed of the recessed defect on the surface of the substrate which causes the reduction in transmission light quantity inducing the transfer pattern defect or causes the mask pattern defect, there is obtained the exposure mask free of occurrence of the transfer pattern defect and the mask pattern defect.

(Structure 8) There is provided a defect correction method of an exposure mask having a transparent substrate formed thereon with a mask pattern which becomes a transfer pattern and having a recessed defective portion on the surface of the substrate at a portion where the mask pattern is not formed. The defective portion has a depth large enough to induce a reduction in transmission light quantity which causes a transfer pattern defect. The method is characterized by removing a peripheral portion of the defective portion to reduce a level difference between the surface of the substrate and the depth of the defective portion, thereby suppressing the reduction in transmission light quantity so as not to cause the transfer pattern defect.

According to Structure 8, by carving to remove the peripheral portion of the recessed defect having the depth large enough to induce the reduction in transmission light quantity which causes the transfer pattern defect, so as to reduce the level difference between the surface of the substrate and the depth of the recessed defect, it is possible to suppress the reduction in transmission light quantity which is induced, for example, by the interference effect due to transmission of the exposure light at the recessed defect and the peripheral portion of the recessed defect. Therefore, when the pattern is transferred onto a transfer target by the use of the exposure mask in which the level difference of the depth of the recessed defect with respect to the surface of the substrate is reduced as described above, the transfer pattern defect no occurs.

(Structure 9) A defect correction method of the exposure mask according to Structure 8 is characterized by contacting a needle-shaped member with the surface of the substrate at the peripheral portion of the defective portion and carving it, thereby removing the peripheral portion of the defective portion.

According to Structure 9, by using the needle-shaped member as means for reducing the level difference between the surface of the substrate and the depth of the recessed defect, a material of the substrate can be physically removed with high accuracy with respect to a carving region and depth.

(Structure 10) A defect correction method of the exposure mask according to Structure 8 or 9 is characterized in that each of level differences from the defective portion to the surface of the substrate after removing the surface of the substrate at the peripheral portion of the defective portion has a depth that causes a reduction in transmission light quantity induced by an interference effect due to transmission of exposure light to be 5% or less.

According to Structure 10, by setting each of level differences from the recessed defect to the surface of the substrate after removing the surface of the substrate at the peripheral portion of the recessed defect to have a depth that causes the reduction in transmission light quantity induced by the interference effect due to transmission of the exposure light to be 5% or less, a change in line width of the transfer pattern can be suppressed to 10% or less so that the transfer pattern defect can be prevented.

(Structure 11) A defect correction method of the exposure mask according to any of Structures 8 to 10 is characterized in that the exposure mask is a 65 nm-compatible exposure mask or a 45 nm-compatible exposure mask according to a semiconductor design rule.

According to Structure 11, the defect correction method of this invention is suitable for the 65 nm-compatible exposure mask or 45 nm-compatible exposure mask according to the semiconductor design rule.

(Structure 12) A manufacturing method of an exposure mask is characterized by comprising a step of performing a defect inspection for the exposure mask to specify a recessed defective portion which is formed on a surface of a substrate to cause a transfer pattern defect due to a reduction in transmission light quantity and a defect correction step of correcting the defective portion by the defect correction method according to any of Structures 8 to 11.

According to Structure 12, by specifying the recessed defect having the depth large enough to induce the reduction in transmission light quantity which causes the transfer pattern defect, and carving to remove the peripheral portion of the specified recessed defect so as to reduce the level difference between the surface of the substrate and the depth of the recessed defect, it is possible to suppress the reduction in transmission light quantity which is induced, for example, by the interference effect due to transmission of the exposure light at the recessed defect and the peripheral portion of the recessed defect. Therefore, there is obtained the exposure mask that does not cause the transfer pattern defect even when the pattern is transferred onto a transfer target.

(Structure 13) A manufacturing method of a semiconductor device is characterized by forming a fine pattern on a semiconductor substrate by a photolithography method using the exposure mask obtained by the manufacturing method of the exposure mask according to Structure 7 or 12.

According to Structure 13, by the use of the lithography technique using the exposure mask obtained by this invention, it is possible to manufacture the semiconductor device having the fine pattern with no pattern defect formed on the semiconductor substrate.

(Structure 14) A manufacturing method of a liquid crystal display device is characterized by forming a fine pattern on a liquid crystal display device substrate by a photolithography method using the exposure mask obtained by the manufacturing method of the exposure mask according to Structure 7.

According to Structure 14, by the use of the lithography technique using the exposure mask obtained by this invention, it is possible to manufacture the liquid crystal display device having the fine pattern with no pattern defect formed on the substrate for the liquid crystal display device.

Effect of the Invention

According to this invention, there can be obtained a transparent substrate for an exposure mask capable of preventing occurrence of a transfer pattern defect, by correcting a recessed defect existing on the surface of the transparent substrate to cause a reduction in transmission light quantity, or capable of preventing occurrence of a mask pattern defect, by correcting a recessed defect that causes the mask pattern defect due to invasion of an etchant as described above. Further, there can be obtained a mask blank with no recessed defect by the use of such a transparent substrate and, moreover, an exposure mask by the use of such a mask blank, which causes no transfer pattern defect and is free of the mask pattern defect.

Further, according to this invention, it is possible to provide an exposure mask defect correction method capable of correcting a recessed defect formed on the surface of a transparent substrate so as to suppress a reduction in transmission light quantity, thereby preventing a transfer pattern defect. Further, there can be obtained an exposure mask with no recessed defect according to such a defect correction method.

Further, according to a lithography technique using such an exposure mask with no recessed defect, there can be obtained a semiconductor device formed with a fine pattern having no pattern defect on a semiconductor substrate or a liquid crystal display device formed with a fine pattern having no pattern defect on a substrate for the liquid crystal display device.

BEST MODE FOR CARRYING OUT THE INVENTION

Hereinbelow, this invention will be described in detail in terms of embodiments thereof.

Embodiment 1

At first, as Embodiment 1 of this invention, description will be made about an exposure mask defect correction method and an exposure mask manufacturing method applied with such a defect correction method.

Generally, a recessed defect such as a crack formed on the surface of a transparent substrate such as a glass substrate is judged to be a failure defect when a reduction in transmission light quantity becomes 6% or more as compared with a normal portion having no such a recessed defect because transfer characteristics of a photomask are adversely affected thereby. It is considered that the reduction in transmission light quantity due to the recessed defect is caused by a loss in transmission light quantity due to scattering of exposure light at the recessed defect portion and a reduction in transmission light quantity induced by the interference effect due to transmission of exposure light at the recessed defect and a peripheral portion of the recessed defect. However, the latter, i.e. the reduction in transmission light quantity due to the interference effect of the exposure light, is often predominant in affecting the transfer characteristics of the photomask. In view of this, it has been studied to improve the reduction in transmission light quantity by paying attention to the interference effect of the exposure light.

The reduction in transmission light quantity due to the interference effect of the exposure light can be modeled by the following equations.

That is, when expressing the interference of the exposure light by an equation of wave motion, $$\sin(x) + \sin(x-a) = 2\cos(a/2)\sin((a/2)-x) \quad \text{Equation (1)}$$

Herein, a represents a change in phase caused by the recessed defect portion and is given by $$a = 2\pi d(n-1)/\lambda \quad \text{Equation (2)}$$

and thus reflective of a depth d of the recessed defect, where n represents a refractive index of the glass substrate and λ represents a wavelength of the exposure light.

Accordingly, for deriving the depth of the recessed defect when the reduction in transmission light quantity becomes 5% which is expected not to cause a problem on the transfer characteristics of the photomask, the ratio of the square of the amplitudes relative to the normal portion is derived and therefore $$\cos 2(a/2) = 0.95$$

from the foregoing equation (1). Accordingly, a satisfying the equation is a=0.451 radians.

Given that the exposure light wavelength λ=193 nm (ArF excimer laser) and the glass substrate refractive index n=1.5, the depth d of the recessed defect satisfying such a becomes 27.7 nm from the foregoing equation (2).

Accordingly, under the conditions of the foregoing exposure light wavelength and glass substrate refractive index, the glass substrate can be used with no problem in terms of the transfer characteristics of the photomask even if there is a recessed defect having a depth of 27 nm.

Therefore, even if there is a recessed defect, on the surface of a substrate, having a depth large enough to induce a reduction in transmission light quantity which causes a transfer pattern defect, by carving to remove a peripheral portion of the recessed defect and reducing a level difference between the surface of the substrate and the depth of the recessed defect after the carving to a predetermined value (e.g. 27 nm), the reduction in transmission light quantity induced by the interference effect due to transmission of exposure light at the recessed defect and the peripheral portion of the recessed defect can be suppressed so as not to cause the transfer pattern defect. An exposure mask in which the level difference of the depth of the recessed defect with respect to the surface of the substrate is reduced as described above does not cause the transfer pattern defect even when a pattern is transferred onto a transfer target.

That is, the exposure mask defect correction method according to this invention is a defect correction method for an exposure mask having a transparent substrate formed thereon with a mask pattern which becomes a transfer pattern and having a recessed defect on the surface of the substrate at a portion where the mask pattern is not formed, the recessed defect having a depth large enough to induce a reduction in transmission light quantity which causes a transfer pattern defect, wherein the method removes a peripheral portion of the recessed defect to reduce a level difference between the surface of the substrate and the depth of the recessed defect, thereby suppressing the reduction in transmission light quantity so as not to cause the transfer pattern defect.

FIG. 1 is a sectional view of an exposure mask having a recessed defect on the surface of a transparent substrate. A mask pattern 2 which becomes a transfer pattern is formed on a transparent substrate 1 and a recessed defect 3 is formed on a surface 1a of the substrate where the mask pattern 2 is not formed. A material of the transparent substrate 1 is a glass material such as, for example, synthetic quartz glass, no-alkali glass, soda lime glass, aluminosilicate glass, or low expansion glass. The recessed defect 3 has a depth large enough to induce a reduction in transmission light quantity which causes a transfer pattern defect and, therefore, it is necessary to apply correction thereto according to the defect correction method of this invention.

FIG. 2 is a sectional view for explaining one embodiment of the exposure mask defect correction method according to this invention.

That is, as shown in the same figure, (a), a peripheral portion of the recessed defect 3 is removed such that a reduction in transmission light quantity due to the recessed defect 3 is suppressed so as not to cause a transfer pattern defect. For example, the peripheral portion of the recessed defect 3 can be removed by contacting a needle-shaped member 4, such as a fine probe having a pointed tip of a stylus profilometer or a scanning probe microscope, with the surface 1a of the substrate at the peripheral portion of the recessed defect 3 and carving the surface 1a of the substrate. In this manner, by using the needle-shaped member 4 as means for removing the peripheral portion of the recessed defect 3 to reduce a level difference between the surface of the substrate and a depth of the recessed defect, a material of the substrate can be physically removed with high accuracy with respect to a carving region and depth.

By removing the peripheral portion of the recessed defect 3 as described above, a level difference between a surface 3a of the substrate and a depth of the recessed defect 3 after removing the peripheral portion of the recessed defect 3 can be made smaller as shown in FIG. 2(b). Simultaneously, with respect also to a depth of the surface 3a of the substrate relative to the surface 1a of the substrate after removing the peripheral portion of the recessed defect 3, it can be made smaller than the depth of the recessed defect 3 relative to the surface 1a of the substrate before the correction.

In the defect correction method according to this invention, each of the level differences from the recessed defect 3 to the surface 1a of the substrate after the correction preferably has a depth that causes a reduction in transmission light quantity induced by the interference effect due to transmission of the exposure light to be 5% or less. FIG. 3 is an enlarged sectional view of the recessed defect 3 applied with the correction by this invention. In this embodiment, a depth d1 of the surface 3a of the substrate with respect to the surface 1a of the substrate after removing the peripheral portion of the recessed defect 3 and a depth d2 of the recessed defect 3 with respect to the surface 3a of the substrate after removing the peripheral portion of the recessed defect 3 are each set to a depth in which the reduction in transmission light quantity induced by the interference effect due to transmission of the exposure light becomes 5% or less which is expected not to cause a problem on the transfer characteristics of the photomask, so that it is possible to suppress a change in line width of the transfer pattern to 10% or less and thus to prevent the transfer pattern defect.

A region that is defined when removing the peripheral portion of the recessed defect is, for example, as shown in FIG. 4, a rectangular region including the whole recessed defect 3. This is because it is, in general, relatively easy to remove a portion in a rectangular shape in a plan view when using the foregoing fine probe or the like. However, the size and shape of the region when removing the peripheral portion of the recessed defect are, of course, not limited thereto. What is essential is that the region includes the whole recessed defect and, thus, for example, the peripheral portion of the recessed defect 3 may be removed in a shape substantially equivalent to that of the recessed defect 3.

According to the exposure mask defect correction method of this invention, by, for example, carving to remove the peripheral portion of the recessed defect having the depth large enough to induce the reduction in transmission light quantity which causes the transfer pattern defect, so as to reduce the level difference between the surface of the substrate and the depth of the recessed defect, it is possible to suppress the reduction in transmission light quantity which is induced by the interference effect of the exposure light at the recessed defect. Therefore, when the pattern is transferred onto a transfer target by the use of the exposure mask applied with the correction to reduce the depth of the recessed defect with respect to the surface of the substrate so as to suppress the reduction in transmission light quantity, the transfer pattern defect no occurs.

FIG. 5 is a sectional view for explaining another embodiment of the exposure mask defect correction method according to this invention.

This embodiment is a correction method when the depth of a recessed defect is deeper. That is, even when there is a recessed defect whose depth is large, the recessed defect can be corrected by carving a peripheral portion of the recessed defect in stages so as to remove it in tiers where each of level differences has a depth small enough to suppress the interference effect of exposure light. In the embodiment shown in FIG. 5, at first as the first stage, a relatively wide region at a peripheral portion of a recessed defect 3 is carved and removed by the use of a needle-shaped member 4 (see the same figure, (b)) and, as the subsequent second stage, a region narrower than that in the first stage is removed in the same manner (see the same figure, (c)). In this manner, a surface 3a of the substrate carved in the first stage and a surface 3b of the substrate carved in the second stage are formed in tiers. Also in this case, each of the level differences from the recessed defect 3 to the surface 1a of the substrate after the correction preferably has a depth that causes the reduction in transmission light quantity induced by the interference effect due to transmission of the exposure light to be 5% or less.

As described above, even the recessed defect with the large depth formed on the surface of the substrate can be corrected by removing the peripheral portion of the recessed defect in tiers in stages, so that the reduction in transmission light quantity can be suppressed.

In the foregoing embodiments, the region where the peripheral portion of the recessed defect has been removed is substantially flat (the removing depth is uniform). However, even when arranged in tiers, each tier may have a slope as long as the interference effect of the exposure light can be suppressed.

In the foregoing embodiments, the description has been made about the method of carving and physically removing the material, such as glass, of the substrate by using the needle-shaped member like the fine probe having the pointed tip as the means for removing the peripheral portion of the recessed defect. However, the removing means is not limited thereto. For example, it is also possible to remove the material of the substrate at the periphery of the recessed defect by FIB (Focused Ion Beam) irradiation.

This invention is suitable for defect correction of a 65 nm-compatible exposure mask or a 45 nm-compatible exposure mask according to a semiconductor design rule (half pitch). For example, in the case of the 65 nm-compatible exposure mask according to the semiconductor design rule, an ArF excimer laser (wavelength: 193 nm) is generally used as exposure light for pattern transfer and, even when a recessed defect having a depth of about 28 nm exists on the surface of a substrate, a transfer pattern defect may occurs. In the case of the 45 nm-compatible exposure mask, immersion exposure with an ArF excimer laser or an F2 excimer laser (wavelength: 157 nm) is used and the depth of a recessed defect that causes a transfer pattern defect can be derived by the foregoing equations (1) and (2). Accordingly, the defect correction method of this invention is suitable for the 65 nm-compatible exposure mask or 45 nm-compatible exposure mask according to the semiconductor design rule.

Further, this invention can correct a recessed defect not only of the binary mask but of a transmission mask such as a halftone phase shift mask, a Levenson phase shift mask, or a chromeless phase shift mask.

In a liquid crystal display device, for example, a thin film transistor liquid crystal display device, a thin film transistor substrate (hereinafter referred to as a "TFT substrate") is used. In the manufacture of this TFT substrate, use is made of an exposure photomask having, on a transparent substrate, a pattern composed of a light-shielding portion, a transparent portion, and a semitransparent portion (also called a graytone mask). Following the recent increase in screen size of a liquid crystal display device, the size of a photomask for use in the manufacture thereof is also unavoidably increased. For example, a large-size substrate for a liquid crystal display device has a size of about 330 mm×450 mm to 1400 mm×1600 mm. Since a large-size photomask for the liquid crystal display device manufactured by the use of such a large-size substrate is quite expensive in manufacturing cost, assuming that a recessed defect is found at the stage of the photomask, this invention capable of correcting such a recessed defect is quite preferable.

Now, description will be made about the exposure mask manufacturing method applied with the defect correction method of this invention.

Generally, an exposure mask can be obtained by carrying out respective processes such as resist film coating, pattern writing (exposure), developing, etching, and removal of a remaining resist pattern by the use of a mask blank having a transparent substrate such as a glass substrate formed thereon with a film that becomes a mask pattern. The exposure mask manufacturing method of this invention comprises a process of performing a defect inspection for the obtained exposure mask to specify a recessed defect which is formed on the surface of the substrate to cause a transfer pattern defect due to a reduction in transmission light quantity and a defect correction process of correcting the recessed defect by the defect correction method according to this invention. Herein, as a method of specifying the recessed defect inducing the reduction in transmission light quantity which causes the transfer pattern defect, there is, for example, a method of evaluating the transfer characteristics of the obtained exposure mask by the use of an evaluation apparatus (e.g. Microlithography Simulation Microscope) so as to specify a defective portion exhibiting a reduction in transmission light quantity. Further, by analyzing such a defective portion in detail by the use of an interatomic force microscope, it is possible to precisely confirm the size, depth, and so on of the recessed defect.

According to the exposure mask manufacturing method of this invention, by specifying, using a defect inspection apparatus or the like, the recessed defect having a depth large enough to induce the reduction in transmission light quantity which causes the transfer pattern defect, and then carving to remove a peripheral portion of the thus specified recessed defect so as to reduce a level difference between the surface of the substrate and the depth of the recessed defect, it is possible to suppress the reduction in transmission light quantity which is induced by the interference effect due to transmission of the exposure light at the recessed defect. Therefore, there is obtained an exposure mask that can prevent the transfer pattern defect even when the pattern is transferred onto a transfer target.

The exposure mask manufacturing method of this invention preferably has a cleaning process for cleaning the surface of the exposure mask after the foregoing defect correction process. By cleaning the surface of the exposure mask after the foregoing defect correction process, it is possible to remove residue generated in carving the peripheral portion of the recessed defect, thereby preventing occurrence of a transfer pattern defect caused by the adhering matter.

In the foregoing cleaning process, it is preferable to carry out the cleaning by the use of a cooling fluid containing fine particles. As the cooling fluid containing the fine particles in this case, dry ice is preferably cited, for example. By adopting the cleaning method of removing the residue generated in carving the peripheral portion of the recessed defect by the use of the fine particles contained in the cooling fluid, the residue can be effectively removed with only small damage to the surface of the transparent substrate.

Further, in the foregoing cleaning process, it is also preferable to carry out the cleaning by the use of a solvent that is insoluble to the mask pattern formed on the transparent substrate while soluble to the transparent substrate. As such a solvent, a glass etching solution containing hydrofluoric acid, sodium hydroxide, or the like is preferably cited. By the use of, for example, the glass etching solution in the cleaning, the residue generated in carving the peripheral portion of the recessed defect can be securely removed.

By moving, if possible, the generated residue from the removal portion to the periphery in the foregoing defect correction process by the use of, for example, the needle-shaped member used in the carving, the subsequent cleaning is facilitated so that the residue can be securely removed without remaining on the substrate.

Embodiment 2

Now, as Embodiment 2 of this invention, description will be made about a method of manufacturing a transparent substrate for a mask blank and methods of manufacturing a mask blank and an exposure mask by the use of such a transparent substrate.

In the foregoing Embodiment 1, the description has been made about the case of correcting the recessed defect found in the defect inspection at the stage of the exposure mask. However, many of recessed defects found at the stage of the exposure mask are considered to originally exist on the surface of the transparent substrate of the mask blank used in the fabrication of the mask. In view of this, in the Embodiment 2, description will be made about the case where a recessed defect existing on the surface of a transparent substrate is corrected at the stage of fabricating a mask blank being a base for use in manufacturing an exposure mask, a mask blank is fabricated by the use of the transparent substrate applied with the correction so as to be free of the recessed defect, and further, an exposure mask is fabricated by the use of such a mask blank.

In the manufacturing method of the transparent substrate for the mask blank according to this invention, by specifying a recessed defect existing on the surface of a transparent substrate in a mask pattern forming region where a mask pattern which becomes a transfer pattern is formed, wherein the recessed defect has a depth large enough to induce a reduction in transmission light quantity which causes a transfer pattern defect, and removing a peripheral portion of the specified recessed defect to reduce a level difference between the surface of the substrate and the depth of the recessed defect, thereby suppressing the reduction in transmission light quantity so as not to cause the transfer pattern defect, so that the transparent substrate for the mask blank applied with the correction of the recessed defect is manufactured.

Specifically, at the stage before forming a mask pattern forming thin film on the transparent substrate whose surface is mirror-polished, the recessed defect existing on the surface of the transparent substrate to cause the reduction in transmission light quantity is specified by the use of a defect inspection apparatus or the like, and the recessed defect correction is carried out with respect to the specified recessed defect according to the foregoing method. That is, the peripheral portion of the specified recessed defect is removed to a depth small enough not to cause the reduction in transmission light quantity by the use of a needle-shaped member or the like.

Since, as described above, it is possible to remove the recessed defect, which causes the reduction in transmission light quantity, at the stage of fabricating the mask blank, specifically, at the stage before forming the mask pattern forming thin film on the mirror-polished transparent substrate, an effect is obtained that correction of the recessed defect is not required at the stage where the exposure mask is fabricated.

Further, as described before, when a recessed defect such as a crack exists on the surface of a transparent substrate at the stage of a mask blank, assuming that, at the time of forming a mask pattern by, for example, wet etching, the recessed defect is located at a boundary of the mask pattern (i.e. the recessed defect exists spanning from a region where the mask pattern is formed to a region where the mask pattern is not formed), an etchant entering the recessed defect further etches a thin film forming the mask pattern to degrade the pattern shape, thereby causing a mask pattern defect such as eating (the state where part of the mask pattern is lacked). Therefore, in this embodiment, when wet etching is carried out as etching for forming a mask pattern in order to manufacture an exposure mask, at the stage before forming a mask pattern forming thin film on a transparent substrate whose surface is mirror-polished, a recessed defect existing on the surface of the transparent substrate and having a depth large enough to cause a mask pattern defect due to invasion of an etchant is specified by the use of the defect inspection apparatus or the like, and a peripheral portion of the specified recessed defect is removed to a depth small enough not to cause the mask pattern defect, thereby reducing a level difference between the surface of the substrate and the depth of the recessed defect. By such correction of the recessed defect, there is obtained the transparent substrate for a mask blank that can prevent occurrence of the mask pattern defect. Further, since, as described above, it is possible to remove the recessed defect, which causes the mask pattern defect, at the stage of fabricating the mask blank, specifically, at the stage before forming the mask pattern forming thin film on the mirror-polished transparent substrate, an effect is obtained that it is possible to prevent occurrence of the mask pattern defect at the stage where the exposure mask is fabricated and, therefore, it is not necessary to perform correction of the mask pattern defect which would occur unless the correction of the recessed defect was carried out.

For example, in the case of the foregoing large-size photomask for use in manufacturing the liquid crystal display device or the like, wet etching is mainly used as etching for forming a mask pattern and, therefore, the manufacturing method of the transparent substrate for the mask blank according to this invention, which is capable of preventing occurrence of the mask pattern defect, is particularly preferable.

Also in this embodiment, details of a method of correcting the recessed defect are the same as those described in the foregoing Embodiment 1. For example, in the case of correcting the recessed defect inducing the reduction in transmission light quantity which causes the transfer pattern defect, each of level differences from the recessed defect to the surface of the substrate after the correction preferably has a depth that causes the reduction in transmission light quantity induced by the interference effect due to transmission of the exposure light to be 5% or less. By setting each of the depths of the recessed defect with respect to the surfaces of the substrate after removing the peripheral portion of the recessed defect to be a depth that causes the reduction in transmission light quantity induced by the interference effect due to transmission of the exposure light to be 5% or less which is expected not to cause a problem on the transfer characteristics of the photomask, a change in line width of the transfer pattern can be suppressed to 10% or less so that the transfer pattern defect can be prevented. The depth of a recessed defect that causes a transfer pattern defect differs depending on a wavelength of exposure light that is used when performing pattern transfer by the use of an exposure mask, and can be specifically derived according to the foregoing equations (1) and (2).

When wet etching is carried out as etching for forming the mask pattern in manufacturing the exposure mask like the large-size mask for use in manufacturing the liquid crystal display device, it is also necessary to correct the foregoing recessed defect that causes the mask pattern defect due to invasion of the etchant. The depth and size of a recessed defect that causes the mask pattern defect due to invasion of the etchant differ depending on a kind of substrate material, a kind of etchant, an overetching amount, the shape of a mask pattern, a positional relationship between the mask pattern and the recessed defect, and so on and, therefore, cannot be generalized. However, it is preferable that a recessed defect having a size (width) of about 0.05 µm or more and a depth of about 0.01 µm or more be corrected because it causes a pattern defect such as eating with a high possibility.

As means for removing the peripheral portion of the recessed defect, the method of carving and physically removing the material, such as glass, of the substrate by the use of the needle-shaped member like the fine probe having the pointed tip or the method of removing the material of the substrate at the periphery of the recessed defect by FIB (Focused Ion Beam) irradiation, as described in the foregoing Embodiment 1, is also applicable in this embodiment.

Further, in this embodiment, a method of contacting a frozen member, obtained by freezing a polishing liquid containing abrasive, with the material of the substrate and carving to physically remove it is also applicable as means for removing the peripheral portion of the recessed defect. By using such a frozen member obtained by freezing the polishing liquid containing the abrasive, it is easy to carve and efficiently remove a relatively wide region of the material of the substrate and, therefore, it is suitable for correction of a recessed defect of a transparent substrate, for example, for a large-size mask blank. Further, by the use of such a frozen member, there is also an effect that it is possible to prevent residue generated during correction of the recessed defect from being mixed into the frozen member, thereby preventing generation of a new defect.

With respect to the frozen member obtained by freezing the polishing liquid containing the abrasive, there is a detailed description in the specification of Patent Application No. 2004-242628 filed before by the present applicant. For example, the frozen member is obtained by pouring a polishing liquid (abrasive concentration: e.g. 0.05 to 20 wt %), obtained by suspending abrasive such as colloidal silica or cerium oxide in a solvent such as ultrapure water or gas dissolved water, into a cooling resistant mold having a desired shape, and freezing the polishing liquid by the use of liquid nitrogen or the like. The shape, size, etc. of the frozen member are optional. For example, the overall shape thereof may be a pillar shape such as a circular cylindrical shape, an elliptic cylindrical shape, or a prism shape, a circular conical shape, a pyramid shape, a spherical shape, or a pillar shape with a tip portion having a circular conical shape, a pyramid shape, or a semi-spherical shape. In short, any shape and size suitable for the recessed defect correction of this invention may be selected. The shape and size of a frozen member can be changed depending on the shape and size of a mold into which a polishing liquid before freezing is poured. The frozen member may be used by attaching it to the tip of a rotating jig such as a router.

Further, a method of partially applying an etchant to the material of the substrate so as to remove it by etching may be applied as means for removing the peripheral portion of the recessed defect. This method also is suitable for removing a relatively wide region of the material of the substrate.

Naturally, the foregoing method of using the frozen member or method of performing the partial etching may also be applied to the correction of the recessed defect at the stage of the exposure mask in the foregoing Embodiment 1.

In order to remove the residue generated during the correction of the recessed defect from the surface of the transparent substrate, it is preferable to carry out, for example, the cleaning process as described in the foregoing Embodiment 1.

A mask blank is obtained by forming a mask pattern forming thin film on the surface of the transparent substrate obtained by the manufacturing method of the transparent substrate for the mask blank according to this invention, by the use of a known film forming method (e.g. sputtering method, chemical vapor deposition (CVD) method, etc.). Herein, the mask pattern forming thin film is, for example, an opaque film or a light-shielding film such as a chromium film, a phase shift film such as a molybdenum silicide (MoSi) film or a MoSiN film, a stacked film of an opaque film and an antireflective film, or a stacked film of a phase shift film and an opaque film.

According to the mask blank manufacturing method of this invention, there is obtained the mask blank removed of the recessed defect on the surface of the substrate which induces the reduction in transmission light quantity causing the transfer pattern defect, or the mask pattern defect. Further, since, as described above, the recessed defect can be removed at the stage of fabricating the mask blank, correction of the recessed defect or the mask pattern defect is not required at the stage of the exposure mask.

Further, an exposure mask is obtained by patterning the mask pattern forming thin film of the mask blank obtained by the mask blank manufacturing method of this invention so as to form a mask pattern, which becomes a transfer pattern, on the transparent substrate. That is, the exposure mask can be obtained by applying respective processes such as resist film coating, pattern writing (exposure), developing, etching, and removal of a remaining resist pattern to the mask blank having the transparent substrate formed thereon with the thin film that becomes the mask pattern.

Since the exposure mask is manufactured by the use of the mask blank that is removed, by the correction in advance, of the recessed defect on the surface of the substrate which causes the transfer pattern defect or the mask pattern defect, there is obtained the exposure mask free of occurrence of the transfer pattern defect and the mask pattern defect.

Embodiment 3

By the use of the exposure mask obtained by the exposure mask manufacturing method of this invention, a semiconductor device can be manufactured by forming a fine pattern on a semiconductor substrate according to the photolithography method.

Since the exposure mask obtained by this invention is applied with the correction of the recessed defect so as not to cause the transfer pattern defect or the mask pattern defect such as eating, it is possible to manufacture the semiconductor device having the fine pattern with no pattern defect formed on the semiconductor substrate according to the lithography technique using the exposure mask obtained by this invention.

Further, by the use of the exposure mask obtained by the exposure mask manufacturing method of this invention, a liquid crystal display device can be manufactured by forming a fine pattern on a liquid crystal display device substrate according to the photolithography method. It is possible to manufacture the liquid crystal display device having the fine pattern with no pattern defect formed on the liquid crystal display device substrate according to the lithography technique using the exposure mask obtained by this invention.

EXAMPLE

Hereinbelow, this invention will be described in further detail in terms of examples, but this invention is not limited to those examples.

The following Example 1 and Example 2 are examples corresponding to the foregoing Embodiment 1.

Example 1

By the use of a mask blank having an opaque film made of chromium and formed on a synthetic quartz glass substrate (size 152 mm×152 mm×6.35 mm) whose surface was precision-polished, a 65 nm-compatible exposure mask according to the semiconductor design rule was fabricated in the following manner.

At first, an electron-beam resist was coated on the mask blank and baking was carried out. Then, writing was performed by the use of an electron-beam writing apparatus and developing was carried out, thereby forming a predetermined resist pattern. A writing pattern was a 0.5 μm line and space pattern.

Then, using this resist pattern as a mask, the chromium opaque film was etched so that a mask pattern of the chromium opaque film was formed on the glass substrate.

The resist pattern remaining on the opaque film pattern was removed by the use of hot concentrated sulfuric acid, thereby obtaining a photomask.

Transfer characteristics of the exposure mask thus obtained were evaluated by the use of a microlithography simulation microscope AIMS193 (manufactured by Carl Zeiss Company), wherein there was found a defective portion exhibiting a reduction of 11% in transmission light quantity. The defective portion was analyzed in detail by the use of an interatomic force microscope and it was confirmed to be a recessed defect on the surface of the glass substrate. The deepest portion of the recessed defect reached 60 nm. In this case, a calculation value of a reduction in transmission light quantity based on the foregoing model equations (equations (1) and (2)) for the reduction in transmission light quantity due to the interference effect of exposure light becomes 22%. It is considered that since the width of the recessed defect is 70 nm which is, for example, about half an exposure light wavelength 193 nm (ArF excimer laser), the interference effect is generated in part of the recessed defect, i.e. not over the whole of the recessed defect, and therefore, the difference arises between the measurement value and the calculation value of the reduction in transmission light quantity.

Then, a region, at a peripheral portion of the recessed defect, of 750 nm×460 nm including the recessed defect was carved to a depth of 20 nm so as to be removed by the use of a photomask repair tool RAVE (manufactured by RAVE LLC). Residue generated in this event was moved to the periphery by the use of the same photomask repair tool.

Subsequently, dry ice was used as a cleaning material and the surface of the mask was subjected to local cleaning by the use of a cleaning tool EcoSnow (manufactured by RAVE LLC).

After the cleaning, the transfer characteristics of the exposure mask were evaluated again by the use of the foregoing AIMS193. It was found that, at the recessed defect portion applied with the correction as described above, the reduction in transmission light quantity was improved to 5% which is a level causing no problem on the transfer characteristics of the exposure mask. By an image intensity profile representing a change in image intensity with respect to a position on a wafer when exposure onto the wafer is carried out by the use of the exposure mask applied with the correction of the recessed defect as described above, it was confirmed that a change in line width of a transfer pattern was suppressed to 10% or less. The exposure conditions in this event were set such that the illumination form was ⅔ annular, the exposure wavelength was 193 nm (ArF excimer laser), the numerical aperture was 0.85, and the coherence factor was 0.85.

As described above, the recessed defect on the surface of the glass substrate, of which correction was conventionally considered impossible, was able to be corrected by the defect correction method of this invention.

Example 2

Transfer characteristics of another exposure mask fabricated in the same manner as in Example 1 were evaluated by the use of, like in Example 1, a microlithography simulation microscope AIMS193 (manufactured by Carl Zeiss Company), wherein there was found a defective portion exhibiting a reduction of 15% in transmission light quantity. The defective portion was analyzed in detail by the use of an interatomic force microscope and it was confirmed to be a recessed defect on the surface of the glass substrate. The deepest portion of the recessed defect reached 80 nm. In this case, a calculation value of a reduction in transmission light quantity based on the foregoing model equations (equations (1) and (2)) for the reduction in transmission light quantity due to the interference effect of exposure light becomes 37%. It is considered that since the width of the recessed defect is 70 nm which is, for example, about half an exposure light wavelength 193 nm (ArF excimer laser), the interference effect is generated in part of the recessed defect, i.e. not over the whole of the recessed defect, and therefore, the difference arises between the measurement value and the calculation value of the reduction in transmission light quantity.

Then, a region, at a peripheral portion of the recessed defect, of 1000 nm×460 nm including the recessed defect was carved to a depth of 20 nm so as to be removed by the use of a photomask repair tool RAVE (manufactured by RAVE LLC). Further, a region, inside the removed region, of 250 nm×460 nm including the recessed defect was carved to a depth of 20 nm so as to be removed. In this manner, in this example, the peripheral portion of the recessed defect was carved to be removed in two stages. Residue generated in this event was moved to the periphery by the use of the same photomask repair tool.

Subsequently, dry ice was used as a cleaning material and the surface of the mask was subjected to local cleaning by the use of a cleaning tool EcoSnow (manufactured by RAVE LLC).

After the cleaning, the transfer characteristics of the exposure mask were evaluated again by the use of the foregoing AIMS193. It was found that, at the recessed defect portion applied with the correction as described above, the reduction in transmission light quantity was improved to 5% which is a level causing no problem on the transfer characteristics of the exposure mask. By an image intensity profile representing a change in image intensity with respect to a position on a wafer when exposure onto the wafer is carried out by the use of the exposure mask applied with the correction of the recessed defect as described above, it was confirmed that a change in line width of a transfer pattern was suppressed to 10% or less. The exposure conditions in this event were the same as those in Example 1.

As described above, the recessed defect on the surface of the glass substrate, of which correction was conventionally considered impossible, was able to be corrected by the defect correction method of this invention. Particularly, in this example, even in the case of the recessed defect whose depth is large, the recessed defect was able to be corrected by carving the peripheral portion of the recessed defect in stages so as to remove it in tiers where each of level differences has a depth small enough to suppress the interference effect of the exposure light.

Although not shown in the foregoing examples, a recessed defect in a transmission mask such as, for example, a halftone phase shift mask, a Levenson phase shift mask, or a chromeless phase shift mask can also be corrected by the same correction method as described above. Further, in the foregoing examples, the case has been shown where the peripheral portion of the recessed defect is removed by the use of a needle-shaped member with a pointed tip like a probe, but not limited thereto. For example, the peripheral portion of the recessed defect can be removed by FIB (Focused Ion Beam) irradiation.

In the foregoing examples, only the example of the cleaning using the dry ice being a cooling fluid containing fine particles has been cited as the cleaning after the defect correction, but not limited thereto. A solvent that is insoluble to the mask pattern formed on the transparent substrate while soluble to the transparent substrate may be used as a cleaning solution to perform cleaning.

The following example is an example corresponding to the foregoing Embodiment 2.

Example 3

Hereinbelow, description will be made about a method of manufacturing a glass substrate for a mask blank for use in a photomask (binary mask), a method of manufacturing a photomask blank, and a method of manufacturing a photomask (exposure mask).

A defect inspection was performed, by the use of a defect inspection apparatus, with respect to the main surface of a synthetic quartz glass substrate (size 152 mm×152 mm, thickness 6.35 mm) whose surface was precision-polished. As the defect inspection apparatus, use was made of a defect inspection apparatus (transparent substance nonuniformity inspection apparatus) described in U.S. Pat. No. 3,422,935 proposed before by the present inventor. This defect inspection apparatus operates such that laser light is introduced into a transparent substance such as a glass substrate and, unless there is a nonuniform portion such as a crack on the surface of the transparent substance, the laser light introduced into the transparent substance repeats total reflection on the surface so as to be confined in the transparent substance and thus substantially not to leak outside, while, if the transparent substance has a nonuniform portion, the total reflection conditions are not satisfied so that the light leaks from the surface of the transparent substance, and therefore, by detecting this leaking light, the defect (nonuniform portion) of the transparent substance is inspected.

As a result, a recessed defect having a depth of 60 nm and a recessed defect having a depth of 80 nm were found in a mask pattern forming region (132 mm×132 mm) where a mask pattern was to be formed. With respect to the positions of these two recessed defects, accurate position coordinates thereof can be specified by using reference marks provided on the synthetic quartz glass substrate as reference points.

When a photomask is fabricated by the use of the foregoing synthetic quartz glass substrate, there arises no problem if the foregoing two recessed defects are hidden by the mask pattern. However, in the case where the recessed defects are located at a transparent portion between portions of the mask pattern, reductions of 22% and 37% in transmission light quantity are respectively induced due to the interference effect of exposure light as described before.

Accordingly, with respect to the foregoing two recessed defects, correction was performed in the following manner using a photomask repair tool RAVE (manufactured by RAVE LLC).

That is, with respect to the recessed defect having the depth of 60 nm, a region of 750 nm×460 nm including the recessed defect was carved to a depth of 20 nm so as to be removed. On the other hand, with respect to the recessed defect having the depth of 80 nm, a region of 1000 nm×460 nm including the recessed defect was carved to a depth of 20 nm so as to be removed and, further, a region, inside the removed region, of 250 nm×460 nm including the recessed defect was carved to a depth of 20 nm so as to be removed. Residue generated in this event was moved to the periphery by the use of the foregoing photomask repair tool like in the foregoing examples. Subsequently, dry ice was used as a cleaning material and the surface of the substrate was subjected to local cleaning by the use of a cleaning tool EcoSnow (manufactured by RAVE LLC).

Then, there was fabricated a photomask blank having a chromium opaque film formed on the surface of the substrate applied with the correction of the recessed defects.

Subsequently, an electron-beam resist was coated on the photomask blank and baking was carried out, then a predetermined pattern was written by the use of an electron-beam writing apparatus and was then subjected to developing, thereby forming a predetermined resist pattern. The writing pattern was a 0.5 µm line and space pattern. For the purpose of evaluation of the foregoing defect correction, the foregoing two recessed defects were set to be located at a transparent portion between portions of a mask pattern when a photomask was fabricated.

Then, using this resist pattern as a mask, the chromium opaque film was etched so that a mask pattern of the chromium opaque film was formed on the glass substrate.

The resist pattern remaining on the opaque film pattern was removed by the use of hot concentrated sulfuric acid, thereby obtaining a photomask.

Transfer characteristics of the photomask (exposure mask) thus obtained were evaluated again by the use of the foregoing AIMS193. It was found that, at each of the recessed defect portions applied with the correction as described above, the reduction in transmission light quantity was improved to 5% which is a level causing no problem on the transfer characteristics of the photomask. By an image intensity profile representing a change in image intensity with respect to a position on a wafer when exposure onto the wafer is carried out by the use of the photomask applied with the correction of the recessed defects as described above, it was confirmed that a change in line width of a transfer pattern was suppressed to 10% or less. The exposure conditions in this event were set such that the illumination form was ⅔ annular, the exposure wavelength was 193 nm (ArF excimer laser), the numerical aperture was 0.85, and the coherence factor was 0.85.

Example 4

Hereinbelow, description will be made about a method of manufacturing a glass substrate for a mask blank for use in a large-size mask for manufacturing a liquid crystal display device, a method of manufacturing a photomask blank, and a method of manufacturing a gray-tone mask (exposure mask).

A defect inspection was performed, by the use of the defect inspection apparatus used in Example 3, with respect to the main surface of a synthetic quartz glass substrate (size 330 mm×450 mm, thickness 10 mm) whose surface was precision-polished. As a result, a recessed defect having a size of 2 µm and a depth of 0.18 µm was found in a mask pattern forming region where a mask pattern was to be formed. With respect to the position of the recessed defect, accurate position coordinates thereof can be specified by using reference marks provided on the synthetic quartz glass substrate as reference points.

When a gray-tone mask is fabricated by the use of the foregoing synthetic quartz glass substrate, if the foregoing recessed defect is located at a boundary of a mask pattern, a pattern defect such as eating is caused due to entry of an etchant into the recessed defect during formation of the mask pattern by wet etching carried out later.

Accordingly, with respect to the recessed defect, by contacting a frozen member obtained by freezing a polishing liquid containing abrasive, a region of 10 mm×10 mm, a region of 5 mm×5 mm and a region of 3 mm×3 mm, each including the recessed defect, were carved to a depth of 0.05 µm, a depth of 0.1 µm, and a depth of 0.15 µm, respectively, so as to be removed. The frozen member was obtained by pouring a polishing liquid (abrasive concentration 10 wt %), obtained by suspending colloidal silica in ultrapure water, into a cooling resistant mold and freezing the polishing liquid by the use of liquid nitrogen. The frozen member had an overall shape of a circular cylinder with a tip portion having a circular conical shape. Thereafter, generated residue was removed by cleaning.

Then, an opaque film in the form of a chromium film was formed on the surface of the glass substrate, applied with the correction of the recessed defect, by sputtering in an Ar gas atmosphere by the use of a chromium target, thereby fabricating a mask blank. The opaque film in the form of the chromium film was formed by setting its thickness such that the optical density became 3 or more when an exposure light source was i-line (wavelength 365 nm).

Then, a positive resist film for laser writing was formed on the chromium film and writing of a predetermined pattern and developing were carried out, thereby forming a resist pattern. This resist pattern exposes a region that forms a semitransparent portion and a region that forms a transparent portion, wherein the resist remains only in a region that forms a light-shielding portion.

Then, using the resist pattern as a mask, the chromium film was patterned by wet etching with an etchant containing ceric ammonium nitrate and perchloric acid, thereby forming an opaque film pattern corresponding to the light-shielding portion. Because of the etching of the chromium film, the glass substrate being the underlayer was exposed in the regions corresponding to the semitransparent portion or the translucent portion and the transparent portion. The remaining resist pattern was removed by the use of concentrated sulfuric acid.

Then, a semitransparent film or a translucent film was formed over the whole surface of the thus obtained substrate having the opaque film pattern on the glass substrate. The semitransparent film was formed by sputtering in a mixed-gas atmosphere of Ar and nitrogen by the use of a chromium target. The ratio of chromium and nitrogen contained in the formed chromium nitride film was 1:4 (Cr:N). The semitransparent film was formed by setting its thickness such that the transmittance became 50% when an exposure light source was i-line.

The foregoing positive resist film was formed again over the whole surface and the second writing was carried out. After the writing, developing was performed to expose the region corresponding to the transparent portion, thereby forming a resist pattern where the resist remained at the light-shielding portion and the semitransparent portion.

Then, using the formed resist pattern as a mask, the semitransparent film in the region that became the transparent portion was removed by wet etching. In this event, use was made of an etchant obtained by properly diluting, with pure water, the etchant used in the foregoing etching of the chromium film. The remaining resist pattern was removed by oxygen ashing.

In the manner as described above, there was fabricated a gray-tone mask formed with the transparent portion where the synthetic quartz glass substrate was exposed, the gray-tone portion (semitransparent portion) composed of the semitransparent film pattern, and the light-shielding portion having the semitransparent film pattern formed on the opaque film pattern.

A defect inspection of the obtained gray-tone mask was performed and it was found that a pattern defect such as eating was not observed at the portion where the foregoing recessed defect was present and the pattern shapes were excellent.

Example 5-A

Hereinbelow, description will be made about a method of manufacturing a glass substrate for a mask blank for use in a large-size mask for manufacturing a liquid crystal display device, a method of manufacturing a photomask blank, and a method of manufacturing a gray-tone mask (exposure mask).

A defect inspection was performed, by the use of the foregoing defect inspection apparatus, with respect to the surface of a synthetic quartz glass substrate (size 330 mm×450 mm, thickness 10 mm) whose surface was precision-polished. As a result, a recessed defect having a size of 2 μm and a depth of 0.18 μm was found in a mask pattern forming region where a mask pattern was to be formed.

With respect to the position of the recessed defect, accurate position coordinates thereof can be specified by using reference marks provided on the synthetic quartz glass substrate as reference points.

When a gray-tone mask is fabricated by the use of the foregoing synthetic quartz glass substrate, if the foregoing recessed defect is located at a boundary of a mask pattern, a pattern defect such as eating is caused due to entry of an etchant into the recessed defect during formation of the mask pattern by wet etching carried out later.

Accordingly, with respect to the recessed defect, by contacting a frozen member obtained by freezing a polishing liquid containing abrasive, which was the same as the frozen member in Example 4, a region of 10 mμm×10 mm, a region of 5 mm×5 mm, and a region of 3 mm×3 mm, each including the recessed defect, were carved to a depth of 0.05 μm, a depth of 0.1 μm, and a depth of 0.15 μm, respectively, so as to be removed. Thereafter, generated residue was removed by cleaning.

Then, as shown in FIG. 6A, a semitransparent film 11 in the form of a molybdenum silicide film (MoSi film) was formed on the surface of the synthetic quartz glass substrate 10 by sputtering in an Ar gas atmosphere by the use of a molybdenum silicide target (the content of molybdenum was 20 mol % and the content of silicon was 80 mol %), wherein the thickness of the film was set such that the transmittance became 50% when an exposure light source was i-line (wavelength 365 nm). The ratio of molybdenum and silicon contained in the formed molybdenum silicide film was 1:4. Then, a chromium nitride film (CrN film) was formed on the molybdenum silicide film by sputtering in a mixed-gas atmosphere of Ar gas and nitrogen gas by the use of a chromium target and further a chromium oxynitride film (CrON film) was stacked by sputtering in a mixed-gas atmosphere of Ar gas and nitrogen monoxide gas, thereby forming an opaque film 12 having an antireflective function on the surface. This opaque film was formed by setting its thickness such that the optical density became 3 or more when the exposure light source was i-line, thereby obtaining a photomask blank.

Then, a positive resist film for laser writing was formed on the opaque film and writing of a predetermined pattern and developing were carried out, thereby forming a resist pattern.

Then, using this resist pattern as a mask, the opaque film was patterned by wet etching with an etchant containing ceric ammonium nitrate and perchloric acid, thereby forming the patterned opaque film on the semitransparent film.

Then, using this patterned opaque film, the semitransparent film was patterned by dry etching, thereby forming the patterned semitransparent film.

Then, the resist film formed on the patterned opaque film was removed by a resist stripping solution.

Then, a resist film was formed again on the patterned opaque film and writing of a predetermined pattern and developing were carried out, thereby forming a resist pattern.

Then, using this resist pattern as a mask, the opaque film was patterned by wet etching with an etchant containing ceric ammonium nitrate and perchloric acid, thereby exposing the semitransparent film in a partial region to form a gray-tone portion.

Finally, the resist film formed on the patterned opaque film was removed by a resist stripping solution, thereby fabricating a gray-tone mask formed with a transparent portion 20 where the synthetic quartz glass substrate was exposed, the gray-tone portion 21 composed of the semitransparent film pattern and having a transmittance of 50%, and a light-shielding portion 22 having the opaque film pattern formed on the semitransparent film pattern and having a transmittance of approximately 0%, as shown in FIG. 6B.

A pattern defect inspection of the obtained gray-tone mask was performed and it was found that there was no film peeling of the semitransparent film pattern made of molybdenum silicide or the opaque film pattern in the form of the stacked film composed of the chromium nitride film and the chromium oxynitride film and the pattern shapes were also excellent.

Example 5-B

A photomask blank and a gray-tone mask were fabricated in the same manner as in the foregoing Example 5-A except that the semitransparent film in Example 5-A was changed to a molybdenum silicide nitride film (MoSiN film) obtained by sputtering in a mixed-gas atmosphere of Ar gas and $N_2$ gas. The ratio of molybdenum and silicon contained in the formed molybdenum silicide film was 1:4.

A pattern defect inspection of the obtained gray-tone mask was performed and it was found that there was no film peeling of the semitransparent film pattern made of molybdenum silicide nitride or the opaque film pattern in the form of the stacked film composed of the chromium nitride film and the chromium oxynitride film and the pattern shapes were also excellent.

Example 5-C

A photomask blank and a gray-tone mask were fabricated in the same manner as in the foregoing Example 5-A except that the semitransparent film in Example 5-A was changed to a molybdenum silicide film ($MoSi_2$ film) obtained by sputtering in an Ar gas atmosphere by the use of a molybdenum silicide target (the content of molybdenum was 33 mol % and the content of silicon was 67%). The ratio of molybdenum and silicon contained in the formed molybdenum silicide film was 1:2.

A pattern defect inspection of the obtained gray-tone mask was performed and it was found that there was no film peeling of the semitransparent film pattern made of molybdenum silicide ($MoSi_2$) or the opaque film pattern in the form of the stacked film composed of the chromium nitride film and the chromium oxynitride film and the pattern shapes were also excellent.

In the foregoing Examples 5-A to 5-C, use is made of the synthetic quartz glass substrate in which the surface of the substrate is removed at the peripheral portion of the recessed defect. However, it is needless to say that even in the case of a synthetic quartz glass substrate with no recessed defect, film peeling between a semitransparent film and the synthetic quartz glass substrate does not occur and a pattern defect in a gray-tone mask also does not occur.

As characteristics required for a photomask blank for use in a gray-tone mask, there is required uniformity of in-plane optical characteristics (transmittance) in an opaque film and a semitransparent film, particularly the semitransparent film. When fabricating a gray-tone mask by etching with an etchant, as cited in the foregoing examples, wherein the in-plane optical characteristics (transmittance) of a semitransparent film is uniform, it is necessary that adhesion of the semitransparent film with respect to a transparent substrate and an opaque film be excellent. In order to satisfy the foregoing characteristics, the photomask blank or gray-tone mask having the semitransparent film and the opaque film on the transparent substrate is preferably configured as follows.

It is preferable that the semitransparent film be made of a material containing at least one metal selected from molybdenum, tungsten, tantalum, titanium, nickel, and aluminum and silicon, and the ratio (metal:silicon) of metal and silicon contained in the semitransparent film be 1:2 to 1:19.

By setting the ratio (metal:silicon) of metal and silicon contained in the semitransparent film to 1:2 to 1:19, the adhesion thereof with respect to the transparent substrate (particularly the glass substrate) becomes excellent. Therefore, when patterning the semitransparent film by etching with the etchant, film peeling thereof with respect to the transparent substrate can be prevented. Even if small recessed portions exist on the surface of the transparent substrate, the film peeling thereof with respect to the transparent substrate can be prevented. Particularly, by setting the ratio of metal and silicon contained in the semitransparent film to 1:2, the stoichiometrically stable composition with the ratio of metal and silicon being 1:2 can be used as a sputtering target necessary for forming the semitransparent film and, therefore, the in-plane optical characteristics (transmittance) of the semitransparent film can be made uniform, which is thus preferable.

It is preferable that the semitransparent film be made of a material further containing nitrogen.

By further containing nitrogen, crystal grains of the semitransparent film are made finer and the film stress is reduced so that the adhesion thereof with respect to the transparent substrate is further improved, which is thus preferable. Further, since it is necessary that the film thickness for obtaining the required optical characteristics (transmittance) be set larger as compared with the case of containing no nitrogen, it is possible to suppress variation in optical characteristics (transmittance) caused by differences in film thickness distribution, which is thus preferable.

It is preferable that the semitransparent film be made of a material containing at least one metal selected from molybdenum, tungsten, tantalum, titanium, nickel, and aluminum and silicon, and the foregoing opaque film be made of a material containing metal and nitrogen and having etching characteristics different from those of the semitransparent film.

By making the semitransparent film of the material containing metal and silicon and making the opaque film of the material containing metal and nitrogen, the adhesion thereof with respect to the transparent substrate (particularly the glass substrate) and further the adhesion thereof with respect to the opaque film become excellent. Therefore, when patterning the semitransparent film by etching with the etchant, film peeling thereof with respect to the transparent substrate and film peeling thereof with respect to the opaque film can be prevented. Even if small recessed portions exist on the surface of the transparent substrate, the film peeling thereof with respect to the transparent substrate can be prevented.

It is further preferable that the metal contained in the semitransparent film be molybdenum and the opaque film be made of the material containing chromium.

The contents of metal, silicon, and nitrogen contained in the semitransparent film are properly adjusted so as to obtain a required transmittance (10% to 80%) with respect to an exposure wavelength (specifically, g-line (wavelength 436 nm), h-line (wavelength 405 nm), and i-line (wavelength 365 nm)) for use in large-size panel production.

In order to obtain the required transmittance and the excellent adhesion with respect to the semitransparent film, the content of nitrogen contained in the opaque film is preferably set to 10 to 80 at %. When the content of nitrogen contained in the opaque film is less than 10 at %, the adhesion strength thereof with respect to the semitransparent film is reduced when wet-etching the semitransparent film, which is thus not preferable. On the other hand, when the content of nitrogen contained in the opaque film exceeds 80 at %, much nitrogen gas is necessarily contained in atmosphere gas during formation of the opaque film so as to raise a possibility of defect occurrence due to abnormal discharge in sputtering, which is thus not preferable.

Further, like in the foregoing Examples 5-A, 5-B, and 5-C, the opaque film may be provided with the antireflective function on the surface. In this case, the surface of the opaque film is made of a chromium compound containing chromium and at least one selected from oxygen, nitrogen, and fluorine. Specifically, there is cited a material such as chromium oxide, chromium nitride, chromium fluoride, chromium oxynitride, chromium oxycarbide, or chromium oxynitride carbide.

The total thickness of the semitransparent film and the opaque film is properly adjusted so that the optical density becomes 3 or more.

The foregoing gray-tone mask can be put to practical use as an LCD (Liquid Crystal Display) gray-tone mask (for fabricating color filter, thin film transistor (TFT), or the like) or a PDP (Plasma Display Panel) gray-tone mask.

BRIEF DESCRIPTION OF THE DRAWINGS

FIG. 1 A sectional view of an exposure mask having a recessed defect on the surface of a transparent substrate.

FIG. 2 A sectional view for explaining one embodiment of an exposure mask defect correction method according to this invention.

FIG. 3 An enlarged sectional view of the recessed defect applied with correction according to this invention.

FIG. 4 A plan view for explaining a region when removing a peripheral portion of the recessed defect.

FIG. 5 A sectional view for explaining another embodiment of an exposure mask defect correction method according to this invention.

Figure 6A:
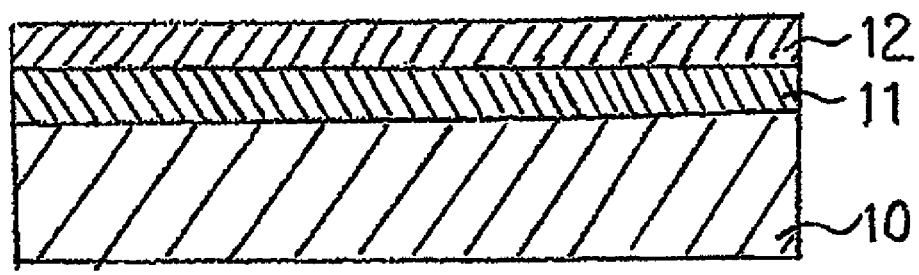
FIG. 6A A sectional view for explaining one example of a gray-tone mask blank applied to this invention.
Figure 6B:
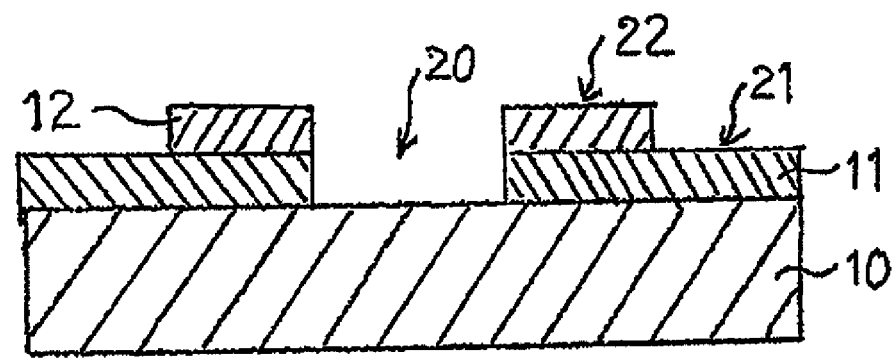
FIG. 6B A sectional view for explaining one example of a gray-tone mask applied to this invention.

DESCRIPTION OF SYMBOLS 1 transparent substrate
2 mask pattern
3 recessed defect
4 needle-shaped member

The invention claimed is:

1. A gray-tone mask blank for manufacturing a liquid crystal display device comprising:
   a transparent substrate;
   a semitransparent film formed on said transparent substrate; and
   an opaque film formed on said semitransparent film,
   said semitransparent film being made of a material containing at least one metal selected from molybdenum, tungsten, tantalum, titanium, nickel, and aluminum and silicon,
   the ratio (metal:silicon) of metal and silicon contained in the semitransparent film being 1:2 to 1:19, and
   transmittance of said semitransparent film being adjusted to 10% to 80% with respect to exposure wavelength of g-line, h-line, and i-line.

2. A gray-tone mask blank according to claim 1, wherein said metal contained in said semitransparent film is molybdenum.

3. A gray-tone mask blank according to claim 1, wherein said semitransparent film further contains nitrogen.

4. A gray-tone mask blank according to claim 1, wherein said opaque film is made of a material containing chromium.

5. A gray-tone mask blank according to claim 4, wherein said opaque film is made of a material containing chromium and nitrogen.

6. A gray-tone mask blank according to claim 5, wherein the content of the nitrogen contained in said opaque film is set to 10 to 80 at %.

7. A gray-tone mask blank according to claim 4, wherein a surface of said opaque film is made of a material selected from chromium oxide, chromium nitride, chromium fluoride, chromium oxynitride, chromium oxycarbide, and chromium oxynitride carbide.

8. A gray-tone mask blank according to claim 1, wherein the total thickness of said semitransparent film and said opaque film is adjusted so that an optical density becomes 3 or more.

9. A manufacturing method of a gray-tone mask comprising:
   forming a resist pattern on said opaque film by forming a resist film on the gray-tone mask blank according to claim 1 and then carrying out writing of a pattern to be transferred onto said semitransparent film and developing;
   forming a patterned opaque film on the semitransparent film by carrying out patterning of said opaque film with wet etching using said resist pattern as a mask;
   forming a patterned semitransparent film by carrying out patterning of said semitransparent film with dry etching or wet etching using said patterned opaque film as a mask;
   removing the resist film formed on said patterned opaque film;
   forming another resist pattern by forming another resist film on said patterned opaque film and then carrying out writing of a pattern to be transferred onto said opaque film and developing;
   forming a gray-tone portion by carrying out patterning of said opaque film with wet etching using said another resist pattern as a mask and thereby exposing a part of said semitransparent film; and
   removing said another resist film formed on said patterned opaque film.

10. A gray-tone mask for manufacturing a liquid crystal display device comprising:
    a transparent portion where a transparent substrate is exposed, a gray-tone portion having a semitransparent film pattern, and a light-shielding portion where an opaque film pattern is formed on said semitransparent film pattern;
    said semitransparent film pattern being made of a material containing at least one metal selected from molybdenum, tungsten, tantalum, titanium, nickel, and aluminum and silicon;
    the ratio (metal:silicon) of metal and silicon contained in the semitransparent film pattern being 1:2 to 1:19; and
    transmittance of said semitransparent film pattern being adjusted to 10% to 80% with respect to exposure wavelength of g-line, h-line, and i-line.

11. A gray-tone mask according to claim 10, wherein said metal contained in said semitransparent film pattern is molybdenum.

12. A gray-tone mask according to claim 10, wherein said semitransparent film pattern further contains nitrogen.

13. A gray-tone mask according to claim 10, wherein said opaque film pattern is made of a material containing chromium.

14. A gray-tone mask according to claim 13, wherein said opaque film pattern is made of a material containing chromium and nitrogen.

15. A gray-tone mask according to claim 14, wherein the content of the nitrogen contained in said opaque film pattern is set to 10 to 80 at %.

16. A gray-tone mask according to claim 13, wherein a surface of said opaque film pattern is made of a material selected from chromium oxide, chromium nitride, chromium fluoride, chromium oxynitride, chromium oxycarbide, and chromium oxynitride carbide.

17. A gray-tone mask according to claim 10, wherein the total thickness of said semitransparent film pattern and said opaque film pattern is adjusted so that an optical density becomes 3 or more.

18. A manufacturing method of a liquid crystal display device characterized by forming a fine pattern on a liquid crystal display device substrate by a photolithography method using the gray-tone mask obtained by the manufacturing method of the gray-tone mask according to claim 9.

19. A manufacturing method of a liquid crystal display device characterized by forming a fine pattern on a liquid crystal display device substrate by a photolithography method using the gray-tone mask according to claim 10.

20. A manufacturing method for manufacturing the gray-tone mask blank according to claim 1 comprising:
- specifying a recessed defective portion existing on a surface of the transparent substrate in a mask pattern forming region where a mask pattern which becomes a transfer pattern is formed, said defective portion having a depth large enough to induce a reduction in transmission light quantity which causes a transfer pattern defect; and
- removing a peripheral portion of said specified defective portion to reduce a level difference between the surface of said transparent substrate and the depth of said defective portion, thereby suppressing the reduction in transmission light quantity so as not to cause the transfer pattern defect.

21. A manufacturing method of the gray-tone mask blank according to claim 20, wherein each of level differences from said defective portion to the surface of said transparent substrate after removing the surface of said transparent substrate at the peripheral portion of said defective portion has a depth that causes a reduction in transmission light quantity induced by an interference effect due to transmission of exposure light to be 5% or less.

22. A manufacturing method for manufacturing the gray-tone mask blank according to claim 1 comprising:
- specifying a recessed defective portion existing on a surface of the transparent substrate in a mask pattern forming region where a mask pattern which becomes a transfer pattern is formed, said defective portion having a depth large enough to cause a mask pattern defect due to invasion of an etchant when forming the mask pattern by wet etching; and
- removing a peripheral portion of said specified defective portion to reduce a level difference between the surface of said transparent substrate and the depth of said defective portion, thereby preventing occurrence of the mask pattern defect.

23. A manufacturing method of a gray-tone mask comprising:
- forming a resist pattern on said opaque film by forming a resist film on the gray-tone mask blank obtained by the manufacturing method of the gray-tone mask blank according to claim 20 and then carrying out writing of a pattern to be transferred onto said semitransparent film and developing;
- forming a patterned opaque film on the semitransparent film by carrying out patterning of said opaque film with wet etching using said resist pattern as a mask;
- forming a patterned semitransparent film by carrying out patterning of said semitransparent film with dry etching or wet etching using said patterned opaque film as a mask;
- removing the resist film formed on said patterned opaque film;
- forming another resist pattern by forming another resist film on said patterned opaque film and then carrying out writing of a pattern to be transferred onto said opaque film and developing;
- forming a gray-tone portion by carrying out patterning of said opaque film with wet etching using said another resist pattern as a mask and thereby exposing a part of said semitransparent film; and
- removing said another resist film formed on said patterned opaque film.

24. A manufacturing method of a gray-tone mask comprising:
- forming a resist pattern on said opaque film by forming a resist film on the gray-tone mask blank obtained by the manufacturing method of the gray-tone mask blank according to claim 22 and then carrying out writing of a pattern to be transferred onto said semitransparent film and developing;
- forming a patterned opaque film on the semitransparent film by carrying out patterning of said opaque film with wet etching using said resist pattern as a mask;
- forming a patterned semitransparent film by carrying out patterning of said semitransparent film with dry etching or wet etching using said patterned opaque film as a mask;
- removing the resist film formed on said patterned opaque film;
- forming another resist pattern by forming another resist film on said patterned opaque film and then carrying out writing of a pattern to be transferred onto said opaque film and developing;
- forming a gray-tone portion by carrying out patterning of said opaque film with wet etching using said another resist pattern as a mask and thereby exposing a part of said semitransparent film; and
- removing said another resist film formed on said patterned opaque film.

25. A manufacturing method of a liquid crystal display device characterized by forming a fine pattern on a liquid crystal display device substrate by a photolithography method using the gray-tone mask obtained by the manufacturing method of the gray-tone mask according to claim 23.

26. A manufacturing method of a liquid crystal display device characterized by forming a fine pattern on a liquid crystal display device substrate by a photolithography method using the gray-tone mask obtained by the manufacturing method of the gray-tone mask according to claim 24.

* * * * *